(12) United States Patent
Kovatchev et al.

(10) Patent No.: US 10,923,908 B2
(45) Date of Patent: Feb. 16, 2021

(54) ELECTRONIC MODULE AND MOTOR VEHICLE AND METHOD FOR LIMITING AN INPUT CURRENT DURING A SWITCH-ON PROCESS OF THE MODULE

(71) Applicant: Continental Automotive GmbH, Hannover (DE)

(72) Inventors: Emil Kovatchev, Vienna (AT); Aurel-Vasile Neic, Kasten bei Boeheimkirchen (AT)

(73) Assignee: Continental Automotive GmbH, Hannover (DE)

( * ) Notice: Subject to any disclaimer, the term of this patent is extended or adjusted under 35 U.S.C. 154(b) by 275 days.

(21) Appl. No.: 15/981,396

(22) Filed: May 16, 2018

(65) Prior Publication Data
US 2018/0337527 A1 Nov. 22, 2018

(30) Foreign Application Priority Data
May 16, 2017 (DE) .................... 10 2017 208 187.2

(51) Int. Cl.
| | | |
|---|---|---|
| H02H 9/00 | (2006.01) | |
| H03K 17/082 | (2006.01) | |
| B60R 16/02 | (2006.01) | |
| H03K 17/687 | (2006.01) | |

(52) U.S. Cl.
CPC ............. *H02H 9/001* (2013.01); *B60R 16/02* (2013.01); *H03K 17/0822* (2013.01); *H03K 17/687* (2013.01); *H03K 2217/0027* (2013.01)

(58) Field of Classification Search
CPC .... H02H 9/001; H02H 9/025; H03K 17/0822; H03K 17/687; H03K 2217/0027; H03K 17/08; B60R 16/02; G05F 1/52; G05F 3/267
See application file for complete search history.

(56) References Cited

U.S. PATENT DOCUMENTS

| | | | |
|---|---|---|---|
| 5,122,724 A | 6/1992 | Criss | |
| 5,715,154 A | 2/1998 | Rault | |
| 6,094,036 A | 7/2000 | Rampold | |
| 9,806,520 B2 * | 10/2017 | Kimura | ................. H02H 9/001 |

(Continued)

FOREIGN PATENT DOCUMENTS

| | | |
|---|---|---|
| JP | H02228217 A | 9/1990 |
| JP | 2001109527 A | 4/2001 |

(Continued)

*Primary Examiner* — Kyle J Moody

(57) ABSTRACT

The disclosure relates to an electronic module comprising a source terminal for receiving an input current from an electrical voltage source and comprising an electrical input capacitance which is effective with respect to the source terminal, wherein the input capacitance is connected to the source terminal via a transistor circuit. The disclosure additionally provides that the transistor circuit is configured to conduct the input current via a respective switching path of at least one transistor, and a control device is configured to switch, during the switch-on process for limiting the input current, a control voltage at a respective control terminal of the at least one transistor, in a plurality of steps, from an off value at which each switching path is switched off, to a connection value at which a contact resistance of each switching path is minimized.

16 Claims, 11 Drawing Sheets

(56) References Cited

U.S. PATENT DOCUMENTS

| | | | |
|---|---|---|---|
| 9,935,480 B2* | 4/2018 | Okanoue | H02H 11/003 |
| 2003/0179034 A1* | 9/2003 | Melis | H02J 7/1461 |
| | | | 327/427 |
| 2008/0094865 A1 | 4/2008 | So et al. | |
| 2011/0169475 A1 | 7/2011 | Koyasu | |
| 2012/0063043 A1 | 3/2012 | Divan | |
| 2016/0301235 A1 | 10/2016 | Okanoue | |

FOREIGN PATENT DOCUMENTS

| | | | |
|---|---|---|---|
| JP | 2003244936 A | 8/2003 |
| JP | 2011166727 A | 8/2011 |
| JP | 2012019640 A | 1/2012 |
| JP | 2015050648 A | 3/2015 |
| JP | 2016226151 A | 12/2016 |
| JP | 2016226152 A | 12/2016 |

* cited by examiner

ELECTRONIC MODULE AND MOTOR VEHICLE AND METHOD FOR LIMITING AN INPUT CURRENT DURING A SWITCH-ON PROCESS OF THE MODULE

BRIEF DESCRIPTION OF THE DRAWINGS

Exemplary embodiments of the disclosure are described below. In this regard, in the figures.

In the figures, functionally identical elements are in each case provided with the same reference designations.

DETAILED DESCRIPTION

The disclosure relates to an electronic module such as may be provided, for example, for operating an LED headlight of a motor vehicle. The module may be connected to an electrical voltage source by a source terminal, to receive an input current. An input capacitance of the module is effective with respect to the source terminal, for which reason a switch-on current strength of the input current has to be limited when the module is switched on. For this purpose, the input capacitance is connected to the source terminal via a transistor circuit. The disclosure also discloses a motor vehicle comprising an electronic module according to the disclosure and a method for limiting the input current during a switch-on process.

Figure 1:
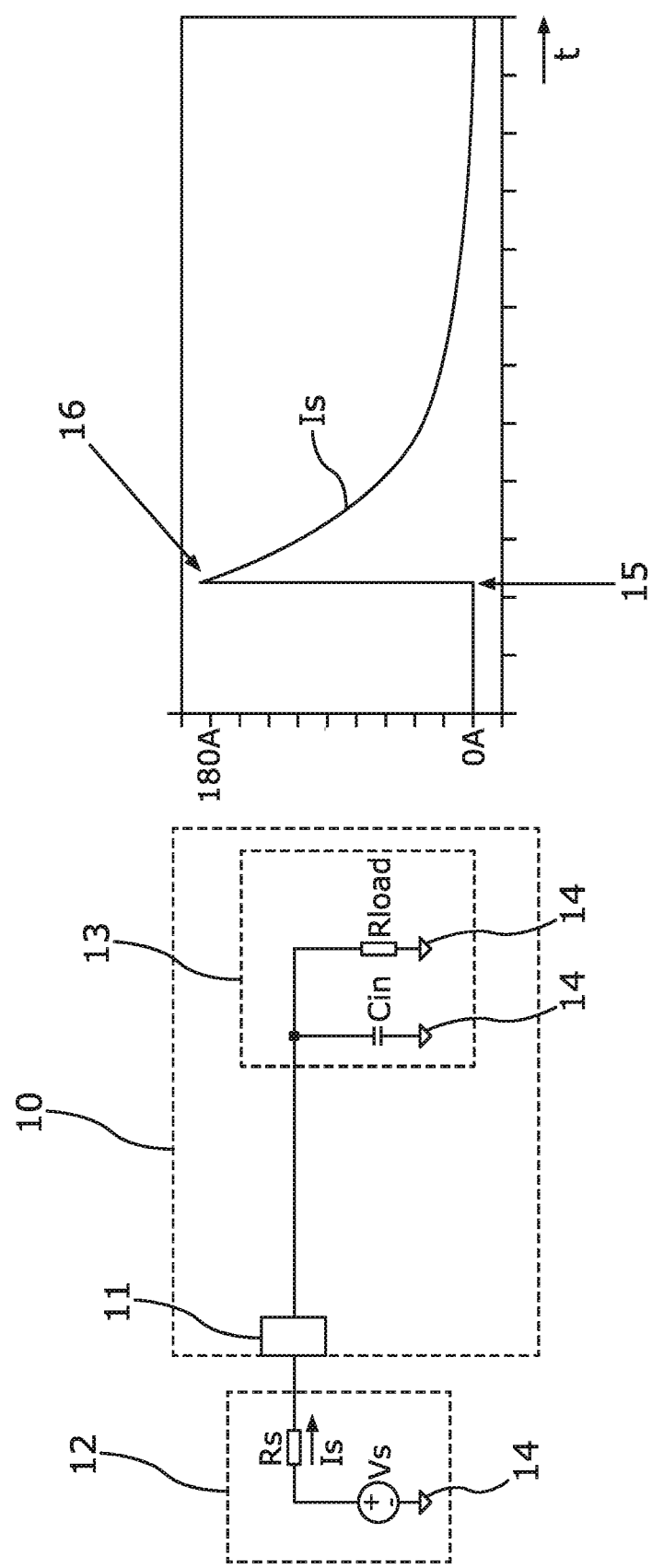
FIG. 1 is a schematic illustration of an exemplary electronic module without switch-on limitation.

The problem is illustrated once more with reference to FIG. 1. FIG. 1 shows a module 10 comprising a source terminal 11 to which an electrical voltage source 12, for example an electrical on-board power system of a motor vehicle, is connected. A supply voltage Vs of the voltage source 12 may drive or generate an input current Is at the source terminal 11, which input current Is has to charge an input capacitance Cin when the module 10 is switched on, said input capacitance Cin being able to be formed, for example, by a capacitor. The actual load or the actual electrical components which are to be operated in a functional unit 13 of the module 10 are represented in FIG. 1 by a load resistance Rload. The circuit may be connected via a ground potential 14. Furthermore, FIG. 1 illustrates the time profile of the input current Is in a diagram plotted against the time t. During a switch-on process 15, the discharged input capacitance Cin gives rise to a high switch-on current surge 16, limited only by the internal resistance Rs of the supplying voltage source 12, the internal resistance of the input capacitance Cin itself and of the lines and of the rise time of the switch-on pulse. It is illustrated that the current strength may rise to over 180 A.

In mechanical switching components for switching the input current (for example relays, mechanical switch), the high switch-on current surge promotes the generation of arcs which may destroy the contact faces. In electronic switching components (for example MOSFET (Metal Oxide Semiconductor Field Effect Transistor) or thyristors) there is the risk of the high switch-on current exceeding its maximum permissible values according to the data sheet and also being able to bring about the destruction of the barrier layer or of the bonding wires (depending on the quantity of energy contained in the switch-on pulse).

It is therefore unavoidable in many applications, in particular from the field of motor vehicle technology, but also from the field of consumable goods or the industrial field, to limit the switch-on current surge 16 with respect to the current strength.

A module of the type described at the beginning, in which, to limit the current strength of the input current, the input capacitance is connected to the source terminal via a transistor circuit, is known, for example from U.S. Pat. No. 6,094,036 A. A parallel circuit composed of a pre-charging resistor and a field-effect transistor which bypasses the latter is connected upstream of a capacitor here. To limit the input current flowing into the capacitor, the field-effect transistor should be operated by a current regulator by a closed current control loop. This is technically complex and susceptible to the influence of parameter fluctuations, such as are caused, for example, by aging and/or heating of the components.

A reduction in the switch-on current is also known from U.S. Pat. No. 5,122,724 A. A field-effect transistor is connected here between an input capacitance and a ground potential, wherein an electrical resistance of a switching path of the field-effect transistor is gradually reduced by an RC element. The speed at which the resistance of the switching path is reduced is defined by the values of the RC element and has to be adapted to the switching behavior of the field-effect transistor. If the latter changed its switching behavior, for example owing to heating, this is not taken into account by the RC element.

The disclosure is based on making available an approach of limiting the input current during a switch-on process of an electronic module which is easy to implement technically, wherein a change in the switching behavior of the transistor circuit which is used (caused, for example by a change in the temperature) may be taken into account as well.

Advantageous refinements of the subject matter of the disclosure are described by the dependent patent claims, the following description and the figures.

A first aspect of the disclosure relates to an electronic module comprising a source terminal for receiving an input current from an electrical voltage source and comprising an electrical input capacitance which is effective with respect to the source terminal, wherein the input capacitance is connected to the source terminal via a transistor circuit. The transistor circuit is configured to conduct the input current via a respective switching path of at least one transistor, wherein a control device is configured to switch, during a switch-on process for limiting the input current, a control voltage at a respective control terminal of the at least one transistor, in a plurality of steps, from an off value at which each switching path is switched off or is electrically non-conductive, to a connection value at which a contact resistance of each switching path is minimized.

During the switch-on process, the input capacitance is first charged. In this context, the contact resistance of each switching path is progressively reduced in steps from a non-electrically conductive state until the contact resistance is minimized. The minimized contact resistance is also referred to as Rdson. In the case of a field-effect transistor (FET) said switching path is the drain-source path. The control terminal is correspondingly the gate of such a field-effect transistor. The input current is that current which is received via the source terminal. The said control voltage is, in particular, the gate-source voltage of the respective transistor.

The specified aspect of the disclosure provides the advantage that the control voltage for controlling the at least one transistor is changed stepwise or in a plurality of steps. A transistor changes from an electrically non-conductive state into the electrically conductive state only at a threshold voltage which is temperature-dependent. Correspondingly, the at least one transistor does not become electrically conductive until at a specific step of the control voltage which is switched in a stepwise fashion. However, in this context, the at least one transistor does not switch completely on (to Rdson) but instead its contact resistance will become greater than the minimum possible value. Through further stepwise changing of the control voltage, the contact resistance is then gradually reduced, so that the input current remains limited as a result. If the at least one transistor changes its switching behavior, for example owing to a change in temperature, this does not have to be explicitly taken into account during the setting of the control voltage by a closed-control system. Instead, the at least one transistor will simply become electrically conductive at another step, and then starting from this step will reduce its contact resistance stepwise at each further step. Therefore, the limitation of the input current is also maintained here. There is therefore no need for explicit adaptation of the control voltage to a changed electrical behavior of the at least one transistor.

In particular, the control device may be configured always to set the same profile of the control voltage for each switch-on process without feedback (e.g. in an open-loop method). As a result, the electronic module may be provided with little switching complexity and therefore in a cost-effective way.

To avoid the need for a feedback loop or feedback, e.g. to provide a pure controller for the at least one transistor, the control device is preferably configured to set the steps independently of a current operating state of the at least one transistor. Therefore, the same time profile of the control voltage always occurs for each switch-on process.

To make available the control voltage at each control terminal of the at least one transistor in a stable fashion, the control device preferably has at least one current mirror circuit. The at least one current mirror circuit is configured here to set a control current in an electrical resistance element as a function of an actuation signal which controls the current mirror circuit. The resistance element may be connected between the gate and the source terminal of the at least one transistor. As a result, the control voltage for the at least one transistor drops across the resistance element. This provides the advantage that the at least one transistor does not have to be controlled directly by the actuation signal but instead the actuation signal is necessary only for predefining the control current, which then generates, for example independently of a current temperature, the control voltage at at least one electrical resistance element. This is particularly temperature-stable.

There may be provision that only a single current mirror circuit is provided. For example, the at least one transistor is a p-channel FET (p-channel field effect transistor). As a result, the control voltage is advantageously permitted to have a voltage value which is lower than a voltage value of a supply voltage of the voltage source. For example, the voltage source may make available a supply voltage of 12 V or 24 V or 48V, while the control voltage may be in a range of less than 10 V.

Alternatively, the at least one transistor may be configured in each case as an re-channel field effect transistor. To generate a suitable control voltage in this way, two current mirror circuits are then provided which are connected to form a cascade. By the first current mirror circuit, an actuation signal for the second current mirror circuit is therefore generated from the actuation signal and then sets the said control current to generate the control voltage for the at least one transistor.

The said actuation signal for controlling the at least one current control circuit may be generated by a switching logic. This is preferably provided by a microcontroller. As a result, a time profile of the actuation signal may be set by programming or predefining a program module for the microcontroller, and therefore preferably also changed. The control device therefore preferably has a switching logic which is coupled to the at least one current mirror circuit and which is configured to predefine, by a control program, the actuation signal for setting the control voltage. If the switching logic is not a microcontroller, the control program may also be implemented in the form of a permanently pre-defined switching arrangement, for example as an ASIC (Application Specific Integrated Circuit) or a flip-flop circuit. The current-limiting method may be parameterized or adapted by providing software control by a control program.

There may be provision that the actuation signal is a pulse-width-modulated output signal of the switching logic which is conducted via a low-pass filter circuit. The low-pass filter circuit may comprise, for example, a capacitor whose capacitance is adapted to a switching frequency of the pulse-width modulation in such a way that the resulting actuation signal is constant over a plurality of switching cycles of the pulse-width modulation. As an alternative to pulse-width modulation, the output signal of a digital-analog converter of the switching logic may be provided directly as an actuation signal. While pulse-width modulation is technically easier to implement than a digital-analog converter, owing to the lack of the low-pass filter circuit the latter may adapt the time profile of the actuation signal more quickly than a pulse-width-modulated output signal which is conducted via a low-pass filter circuit. Therefore, for example by the digital-analog converter it is possible to switch off or carry out a switch-off process for the module by switching off the at least one transistor.

For such a rapid switching-off of the at least one transistor there may additionally or alternatively be provision that an electrode of a capacitor which is provided for reducing a ripple of the actuation signal is connected to a ground potential via a switch element. The switch element may be implemented, for example, on the basis of a transistor, in particular a field effect transistor. The capacitor may be, for example, the capacitor of the low-pass filter circuit. The switch element is configured to electrically connect the electrode of the capacitor to the ground potential as a function of a switch-off signal to discharge the capacitor. As a result, the actuation signal then also drops to the value of the ground potential, as a result of which the at least one transistor is then electrically switched off.

The input current may be conducted via the switching path of just a single transistor. This makes it possible to bring about the limiting of the input current with low expenditure in terms of switching technology, and therefore in a cost-effective way. However, such a transistor in the form of a field effect transistor may have a so-called body diode. To avoid in this case a polarity-reversal protection against connection of the voltage source to interchanged poles (ground or minus at the source terminal and positive at the ground terminal of the module), preferably two transistors are provided whose switching paths are connected in series, wherein forward directions of a respective body diode of the transistors are connected in opposing directions. In the case of switching paths which are connected in an off direction, the body diodes therefore block one another.

The switch-on process, that is to say the charging of the input capacitance in the case of limited input current, is preferably carried out over a multiplicity of steps. This thus provides the advantage that a change in the switch-on behavior of the at least one transistor of the transistor circuit and resulting shifting of the threshold voltage of the at least one transistor to another step does not lead to a situation in which the charging of the input capacitance extends or lasts beyond the last step, with the result that an unlimited input current (in the case of Rdson) would flow to the input capacitance.

To achieve this, a respective time period of each of the stages preferably has a value which corresponds to a time constant of the input capacitance in such a way that during one stage or during only two or three stages the at least one transistor changes from an off state into an electrically conductive state, and subsequently the input current rises to a maximum and drops again. In other words, the switching-on of the input current up to the rise to the maximum value lasts for only one step or at maximum two or three steps. Overall, preferably at least five intermediate steps are provided between the off value and the connection value.

In the described fashion, the input capacitance may mainly or completely be provided by a capacitor or a parallel connection of a plurality of capacitors. An input capacitor may be provided as an energy buffer and/or as a filter of a voltage profile and/or current profile, in order, for example, to make available the electromagnetic compatibility and/or provide robustness against fluctuations in the supply voltage of the voltage source.

The at least one transistor is preferably connected, when viewed from the source terminal in a positive line (e.g. not at the ground potential) upstream of both the input capacitance itself and also of the other functional components of the module, that is to say of further electronic functional components or electronic circuits of the module. As a result, not only the input capacitance but also the other electronic functional components may be disconnected electrically from the source terminal by the at least one transistor.

The electronic module is preferably provided for use in a motor vehicle. Correspondingly, a further aspect of the disclosure relates to a motor vehicle comprising an electrical voltage source and comprising an embodiment of the electronic module according to the disclosure.

The voltage source may be, for example, an on-board power system of the motor vehicle, for example a 12 V on-board power system or a 24 V on-board power system or a 48 V on-board power system. The electronic module may for example be provided for operating LEDs of a headlight of the motor vehicle in order e.g. to function as a power source for the LEDs. The limiting of the input current during the switch-on process of the electronic module provides the advantage that emergency switching-off of the voltage source or of the module owing to a threshold value for the current strength of the input current comprising been exceeded is prevented, since this threshold value is not exceeded as a result of the limitation of the input current.

In particular, as a result of the operation of an electronic module according to the disclosure, according to a further aspect of the disclosure a method is obtained by which the input current is limited during a switch-on process of the electronic module. The method is based on the fact that an electrical input capacitance of the module is connected via a transistor circuit to a source terminal for a voltage source. During the switch-on process, an input current is received from the electrical voltage source via the source terminal. The transistor circuit conducts the input current via a respective switching path of at least one transistor. In this context, a control device for limiting the input current switches a control voltage to a respective control terminal of the at least one transistor, in a plurality of steps, from an off value, at which each switching path is switched off, in a plurality of intermediate steps to a connection value, at which a contact resistance of each switching path is minimized.

The disclosure also includes developments of the method according to the disclosure comprising features which have already been described in connection with the developments of the electronic module according to the disclosure. For this reason, the corresponding developments of the method according to the disclosure are not described here again.

The exemplary embodiments discussed below are preferred embodiments of the disclosure. In the exemplary embodiments, the described components of the embodiments each represent individual features of the disclosure which are to be considered independently of one another, each also refine the disclosure independently of one another and are therefore also to be considered to be a component of the subject matter of the disclosure individually or in a combination other than that shown. Furthermore, the described embodiments may also be supplemented by further features of the disclosure that have already been described.

Figure 2:
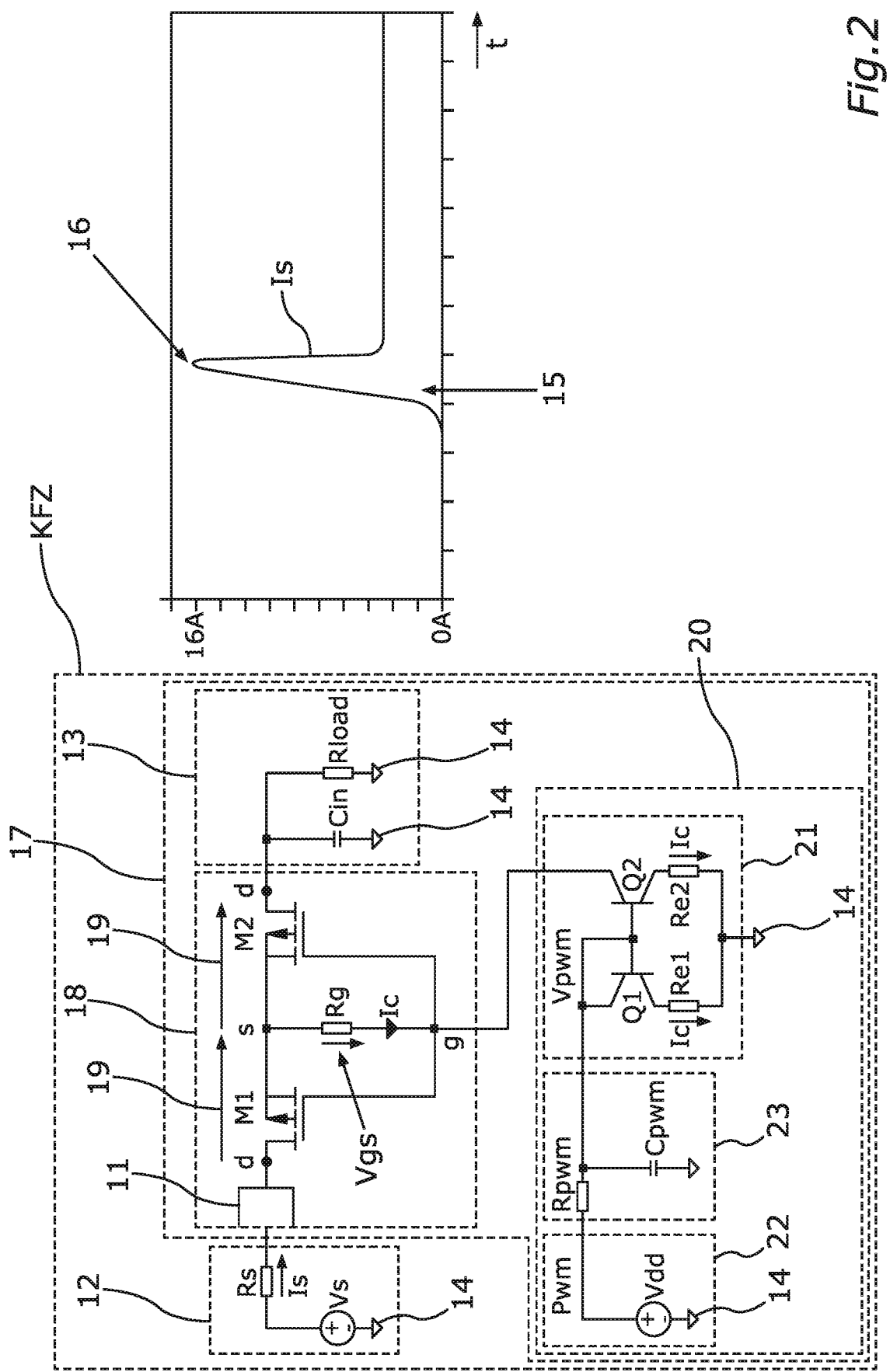
FIG. 2 is a schematic illustration of an exemplary embodiment of the module according to the disclosure.

FIG. 2 shows, in a way corresponding to FIG. 1, a module 17 to whose source terminal 11 a voltage source 12 of the described type may be connected. The module 17 may be installed in a motor vehicle Kfz. A module may be e.g. a control unit or a component of a control unit. The motor vehicle Kfz may be a car, e.g. a passenger car or a truck.

A transistor circuit 18 is connected upstream of an input capacitance Cin and the other electronic functional components (represented by Rload), e.g. the transistor circuit 18 is connected electrically between the source terminal 11, on the one hand, and the input capacitance Cin and the functional components Rload, on the other, so that the input current Is is conducted via switching paths 19 of the transistors M1, M2 of the transistor circuit 18. The transistor circuit 18 is therefore connected between the source terminal 11 and all the electrical functional components 13 of the module 17 which are to be connected. The transistors M1, M2 are field effect transistors with a drain d, a source s and a control terminal/gate g. A control voltage Vgs (gate-source voltage) is generated by a control current Ic via a resistance element Rg.

The control current Ic is set by a control device 20 which has a current mirror circuit 21 for setting the control current Ic. A switching logic 22 may generate a pulse-width-modulated output signal PWM by a switchable voltage source Vdd. The pulse-width-modulated output signal PWM may be smoothed or its ripple may be reduced, by a low-pass filter circuit 23. As a result, an actuation signal Vpwm which controls the current mirror circuit 21 is provided at the output of the low-pass filter circuit 23. The low-pass filter circuit 23 may comprise a capacitor Cpwm and also an electrical resistor Rpwm for making available an RC element.

The actuation signal Vpwm may be provided at the respective control terminal of two transistors Q1, Q2 of the current mirror circuit 21. In each case the same control current Ic then flows to the ground potential 14 through the resistance elements Re1, Re2 which are connected downstream of each transistor Q1, Q2.

FIG. 2 illustrates how, by setting a stepped actuation signal Vpwm the input current Is is set during a switch-on process 15 with a maximum 16 which is less than when there is no transistor circuit 18 (compare FIG. 1). For example, the maximum 16 is less than 10% of the maximum which is obtained without the transistor circuit 18.

Figure 3:
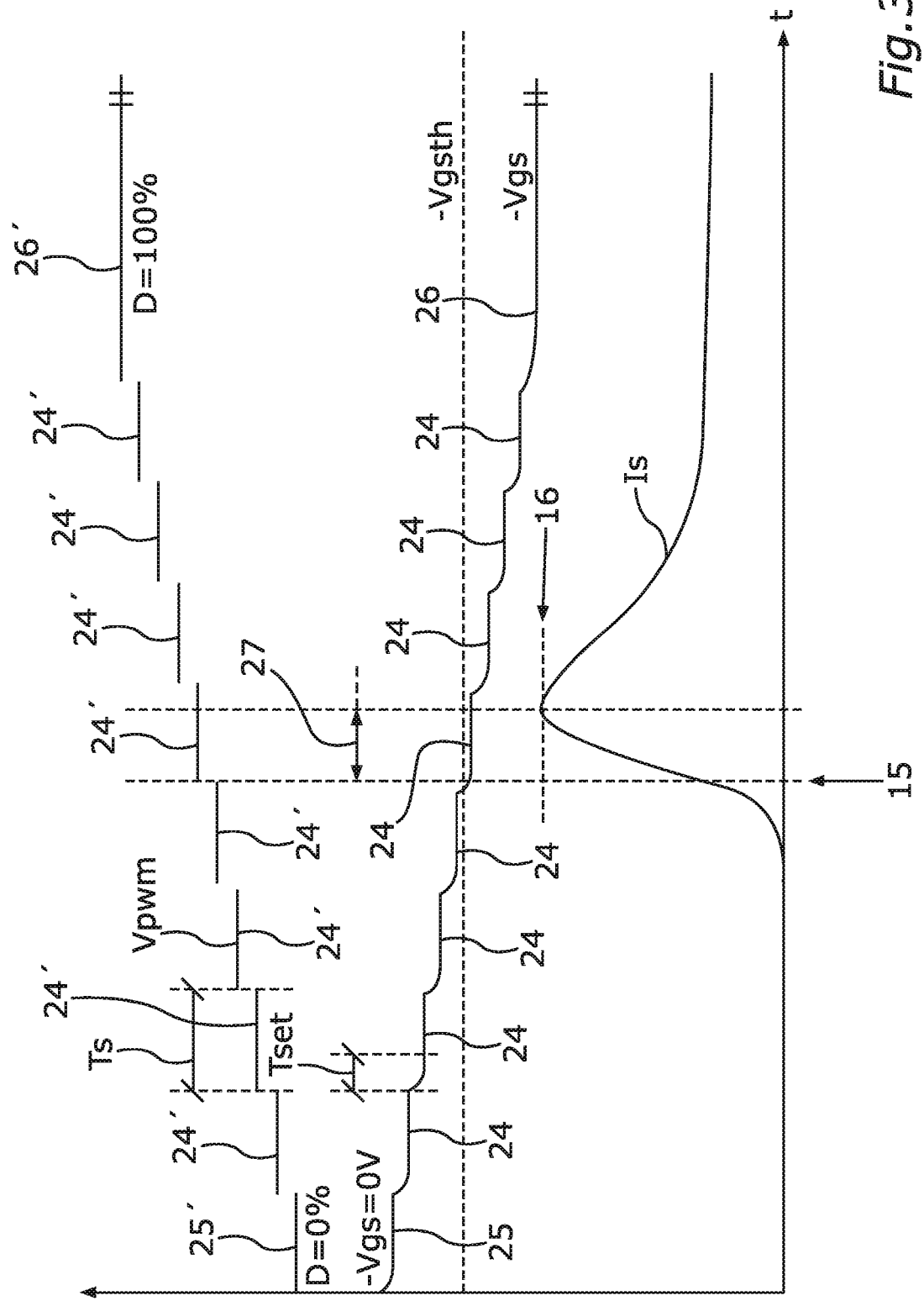
FIG. 3 is a diagram with schematic profiles of exemplary control voltage, actuation signal and input current plotted over time.

FIG. 3 illustrates how by setting the sample rate or the pulse duty factor D of the pulse width modulation PWM the actuation signal Vpwm is adjusted in a plurality of steps 24' from an off value 25' (D=0%) to a connection value 26' (D=100%) and as a result the control voltage Vgs is adjusted stepwise from an off value 25 (0 V) to a connection value 26 in a plurality of steps 24.

As soon as a step 24, in which a switching threshold or threshold voltage Vgsthr is reached, is achieved the switch-on process 15 starts, e.g. the transistors M1, M2 become electro-conductive when the threshold voltage Vgsthr is reached. Within this step 24 or within two steps 24, the input current Is reaches its maximum 26 and then drops again. That is to say a limiting phase 27 for the input current Is lasts at most once or twice or three times the step duration Ts.

Figure 4:
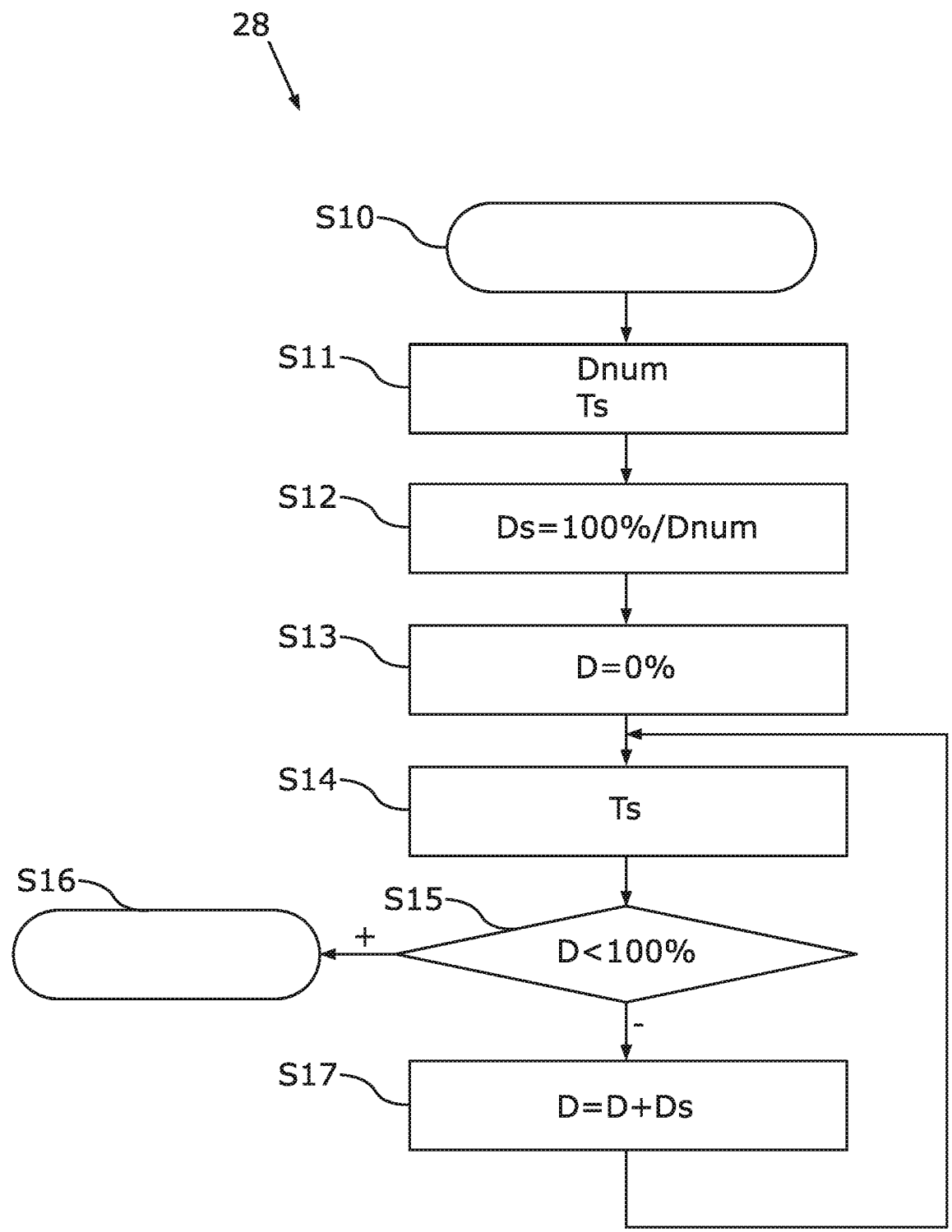
FIG. 4 is a flow diagram of an exemplary embodiment of the method according to the disclosure.

To set the step duration Ts by the logic circuit 22, it is possible, as illustrated in FIG. 4, to execute a control program 28 by the switching logic 22. The switching logic 22 may for this purpose comprise, for example, a microcontroller.

Proceeding from a start S10, the number Dnum of steps 24' and the step duration Ts may be defined in a step S11. In a step S12, the step size Ds=100%/Dnum is defined. In a step S13, the controller of the transistor circuit starts with the off value 24' (D=0%). In a step S14, the current step is retained for the step duration Ts. In a step S15, it is checked whether the connection value 26' is reached. If this is the case (represented by a "+" symbol) the method is stopped in a step S16, e.g. the contact resistance is maintained by retaining the connection value 26'. If the connection 27' has not yet been reached in the step S15 (represented by a "−" symbol), in a step S17 the next step is thus set in that the pulse width modulation PWM is increased by the step size Ds by increasing the pulse duty factor D (D=D+Ds) and the process is continued in step S14.

Figure 5:
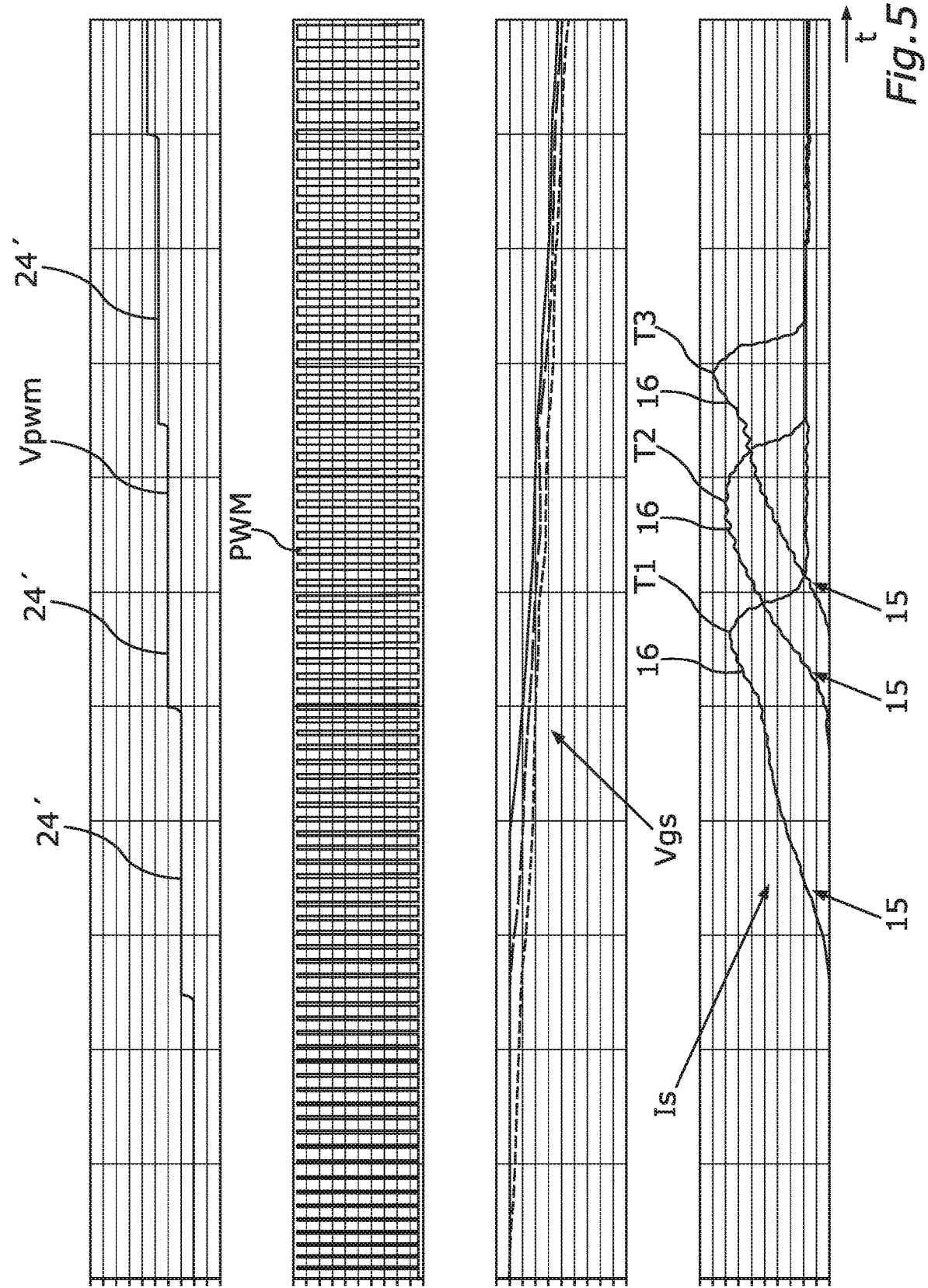
FIG. 5 is a diagram of exemplary measurement signals such as are obtained with the method for different exemplary operating states of transistors.

FIG. 5 illustrates how the switch-on process 15 starts at different steps 24' for three different temperatures T1, T2, T3 (T1>T2>T3). The temperatures T1, T2, T3 have been measured at the transistors M1, M2. The respective temperature T1, T2, T3 therefore describes a current operating state of the at least one transistor M1, M2.

Figure 6:
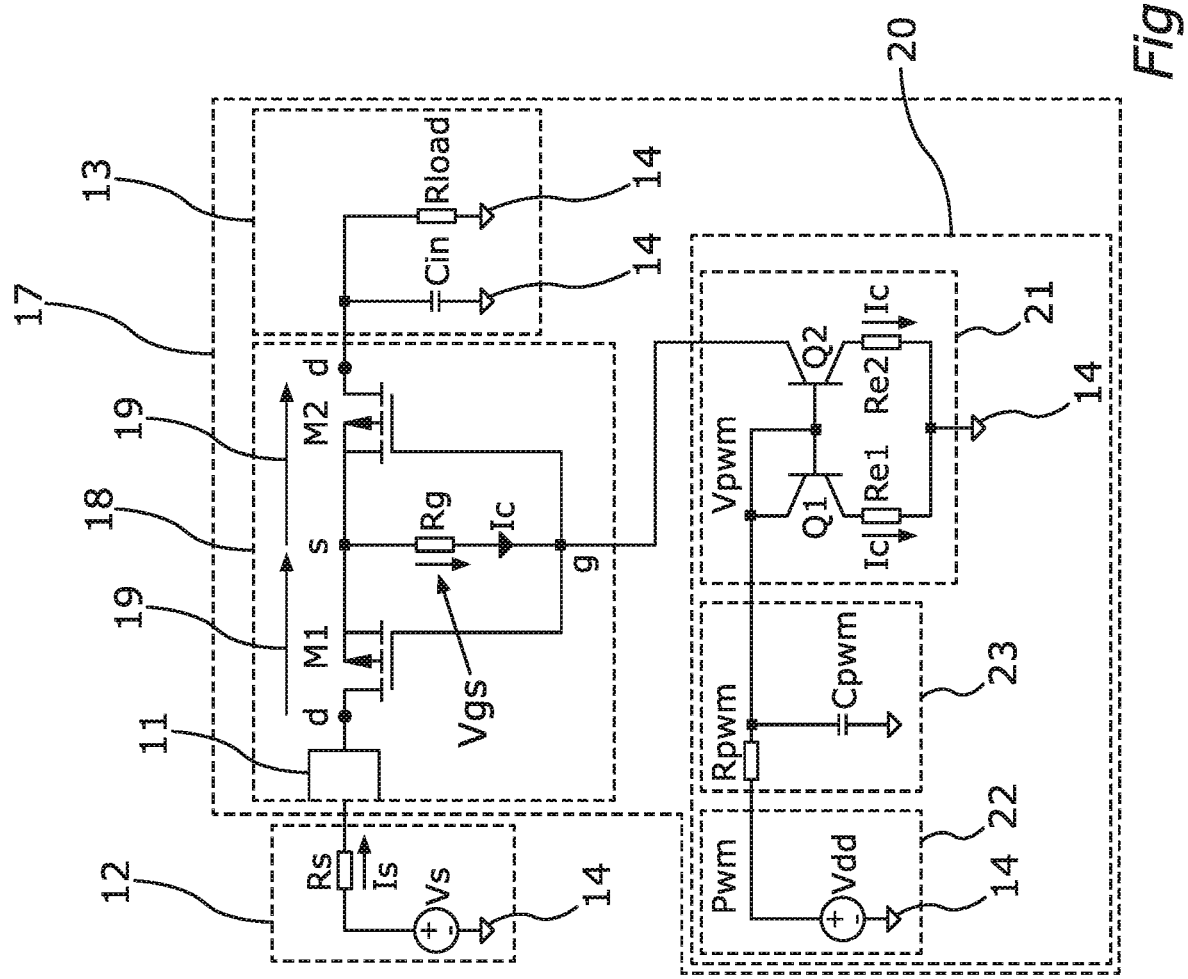
FIG. 6 is a schematic circuit diagram of an exemplary module from FIG. 2.

FIG. 6 illustrates once more the module 17 from FIG. 2 for the purposes of further description. The electronic "resistance" such as is provided by the transistor circuit 18 for the input current Is, is embodied, in the exemplary embodiment from FIG. 6, with two p-channel MOSFETs as transistors M1, M2, to eliminate the conductivity of its body diodes. For this purpose, the two source contacts of the transistors M1, M2 are electrically connected. For the actuation of the two transistors M1, M2 a gate voltage is necessary which is lower than its source voltage. In other words, the potential of the gate g should be lower than the potential of the source contact s. This control voltage Vgs therefore has a negative sign if the source contact s is taken as a reference.

The control voltage Vgs is brought about using an electrical resistance element Rg and a variable control current Ic which may be adjusted by software. For this purpose, the current mirror 21, composed of the transistors Q1, Q2 is used. The transistors Q1, Q2 are preferably provided by a double transistor, to eliminate fluctuations in the parameters of the temperature and of the transistor. The resistors Re1, Re2 may also have the same value to symmetrize the current mirror 21 as local negative feedback elements.

This results in the control current Ic which flows through Re1 in the left-hand limb and is reflected through Re2 in the right-hand limb as $$Ic=(Vpwm-Vbe)/Re1,$$

wherein Vbe is the base-emitter voltage of the transistor Q1.

The actuation signal Vpwm is formed from the pulsed PWM voltage source Vdd (5 V or 3.3 V from a microcontroller output may typically be used) with the low-pass filter circuit 23 (Rpwm/Cpwm) by varying the pulse duty factor D. This is calculated as:

$$Vpwm=D \cdot Vdd.$$

The control voltage Vgs for the transistors M1, M2 is therefore:

$$Vgs=((D \cdot Vdd-Vbe)/Re1) \cdot Rg$$

and may be predefined with the pulse duty factor D.

A time constant Tpwm of the low-pass filter or of the low-pass filter circuit 23 may be selected such that after the changing of the pulse duty factor step (D=D+Ds) the control voltage Vgs levels off within the step duration Ts:

$$Tset=6 \cdot Tpwm=6 \cdot Rpwm \cdot Cpwm<0.5Ts.$$

Tset is a time until the steady state is reached after the pulse duty factor D has changed.

Ts is the duration of the pause in the respective pulse duty factor, e.g. either the step duration or the working point.

In the embodiment shown, a suitable working point for the transistors of the transistor circuit 18 at which the field effect transistors are operated actively, e.g. with a contact resistance which is higher than the minimum contact resistance Rdson, is always found under all circumstances by this sweep or this sequence of steps 24. Subsequently, it is ensured that when the connection value is reached, they are operated with the minimum contact resistance, e.g. they are set to the saturated, low-impedance switching mode.

To limit a current surge during the switch-on process 15, as a result the diagram from FIG. 3 is obtained as an idealized profile.

FIG. 5 illustrates a simulation with the three temperatures T1=150° C., T2=25° C., T3=−40° C.

It is apparent that the thermal stability is also ensured thanks to the impression of the current and the control of the control current Ic by the current mirror 21. A deviation by a maximum of 2 A is obtained for the respective maximum 16.

The current limitation may be implemented compactly and in an unregulated, open-loop method by the control program 28 and may be adapted to different transistor types by simply changing or parameterizing in the step S11

Figure 7:
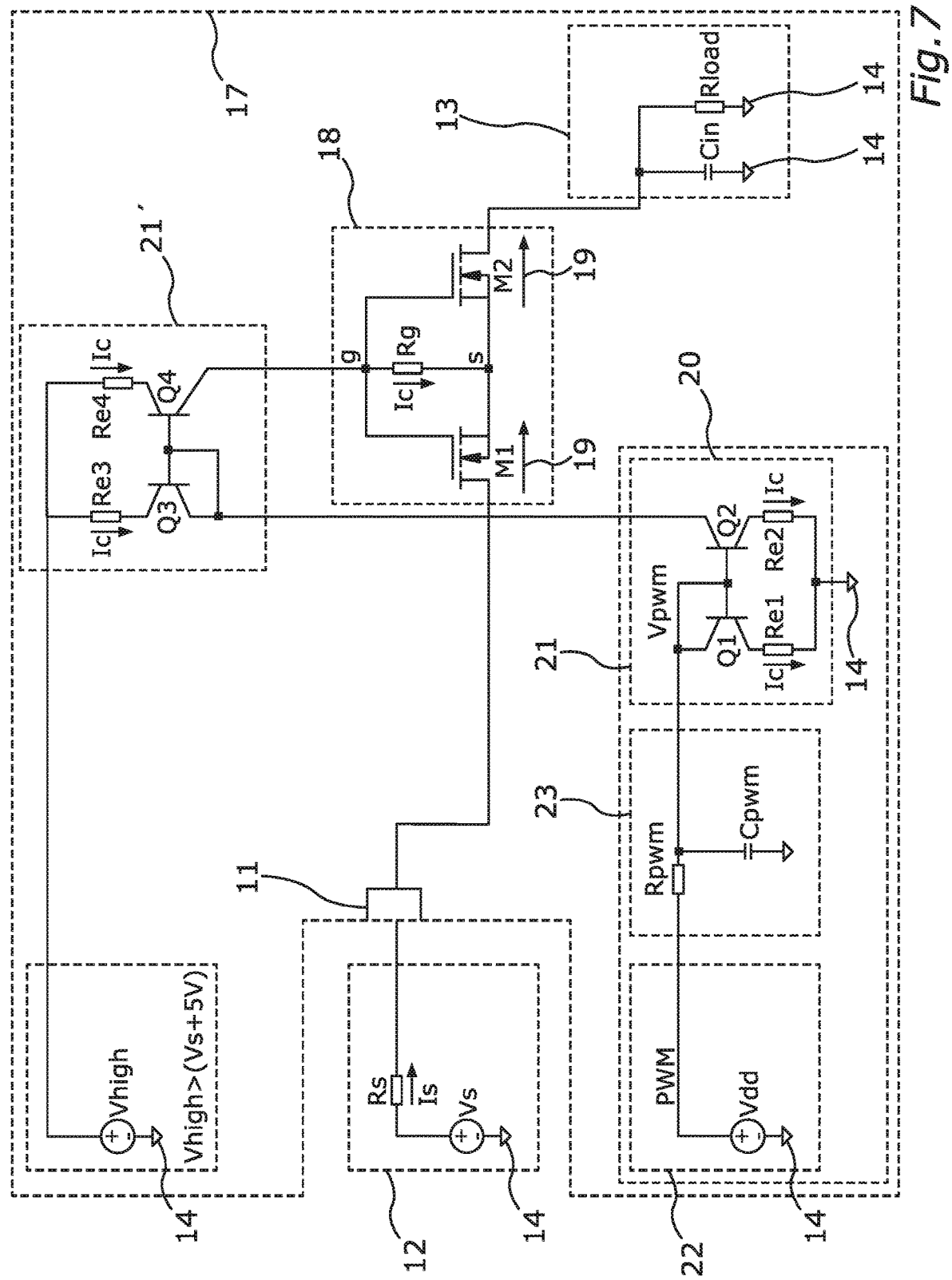
FIG. 7 is a schematic circuit diagram with an exemplary module which has two exemplary current mirrors.

FIG. 7 shows an embodiment of the module 17 in which the transistors M1, M2 of the transistor circuit 18 are n-channel field effect transistors. The n-channel field effect transistors M1, M2 have the advantage of the relatively low minimum contact resistance Rdson (channel resistance) for the same purchase price in comparison with p-channel field effect transistors.

To switch through the transistors M1, M2, the gate voltage at the gate g which is higher than the source voltage at the source s. For this purpose, a second supply voltage Vhigh which is higher than the supply voltage Vs of the voltage source 12 for the module 17 is provided in the module 17. The supply voltage Vhigh may be provided, for example, by a charging pump (H bridge driver) or an up converter such as is provided in LED lighting devices for vehicle headlights. Corresponding integrated circuits (IC) according to prior art are available for this purpose.

The polarity reversal protection for the source terminal 11 may be provided in the described manner by a series connection of the switching paths 19 of the transistors M1, M2 with opposing connection of the body diodes of the transistors M1, M2. For this purpose, the sources s of the two transistors M1, M2 may be connected to one another.

To actuate the n-channel field effect transistors M1, M2, an additional current mirror circuit 21' is provided with the transistors Q3, Q4 which transmit the control current Ic into the voltage range above the supply voltage Vs. The current mirror circuits 21, 21' are connected to form a cascade, e.g. the control current Ic of the current mirror circuit 21 controls the current mirror circuit 21'.

The two transistors Q3, Q4 are advantageously embodied in a housing, that is to say as a double transistor, by which the described advantages are obtained. The symmetry of the resistors Re3, Re4 permits local negative feedback to balance the current mirror 21'.

The rest of the circuit is constructed in a way corresponding to the circuit of the module 17 from FIG. 6, for which reason reference is made to the corresponding explanation of the reference symbols in FIG. 6.

Figure 8:
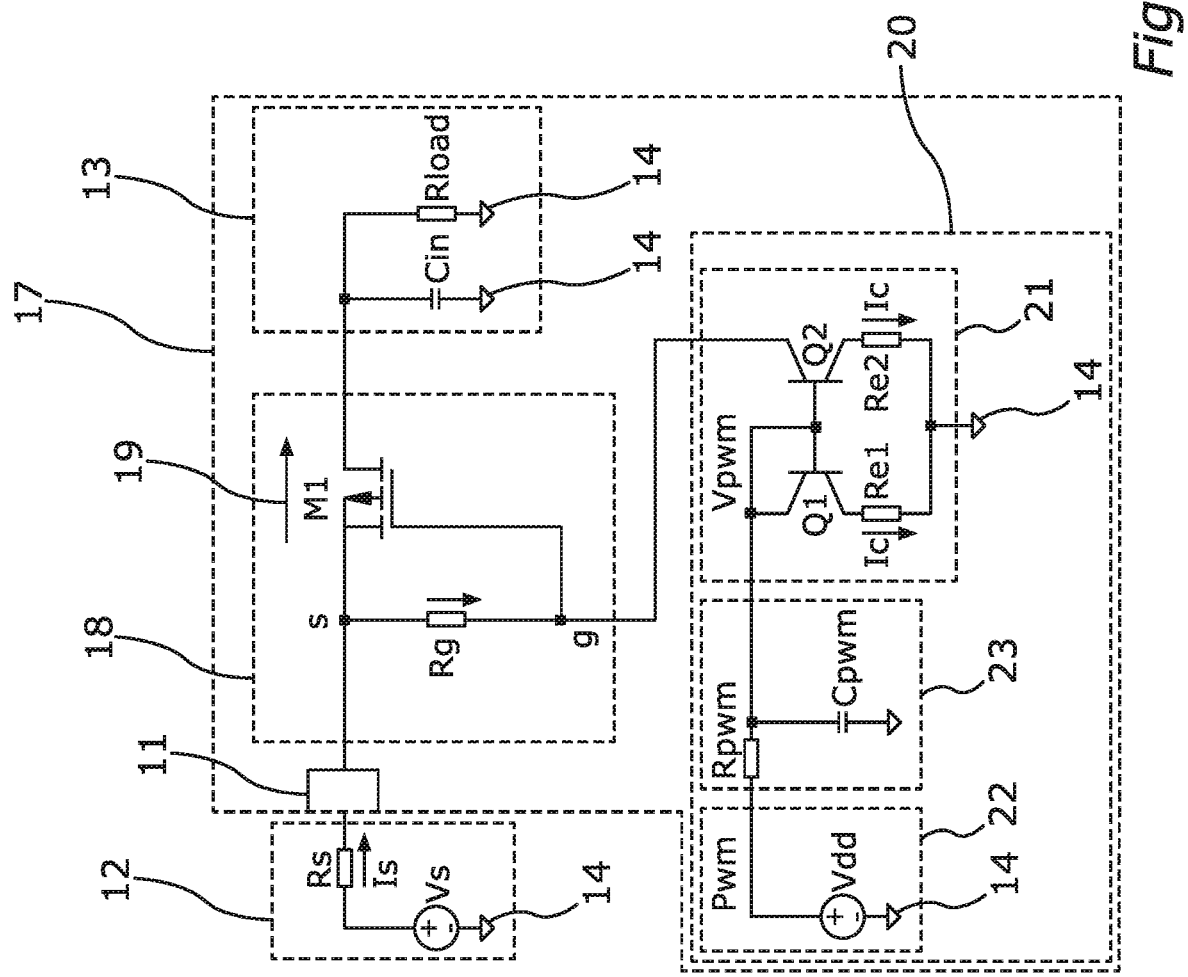
FIG. 8 is a schematic circuit diagram with an exemplary module which has just one exemplary transistor.

FIG. 8 illustrates the embodiment of the module 17 which corresponds to the embodiment from FIG. 6, wherein the transistor circuit 18 however only has a single transistor M1 via whose switching path 19 the input current Is is conducted.

Figure 9:
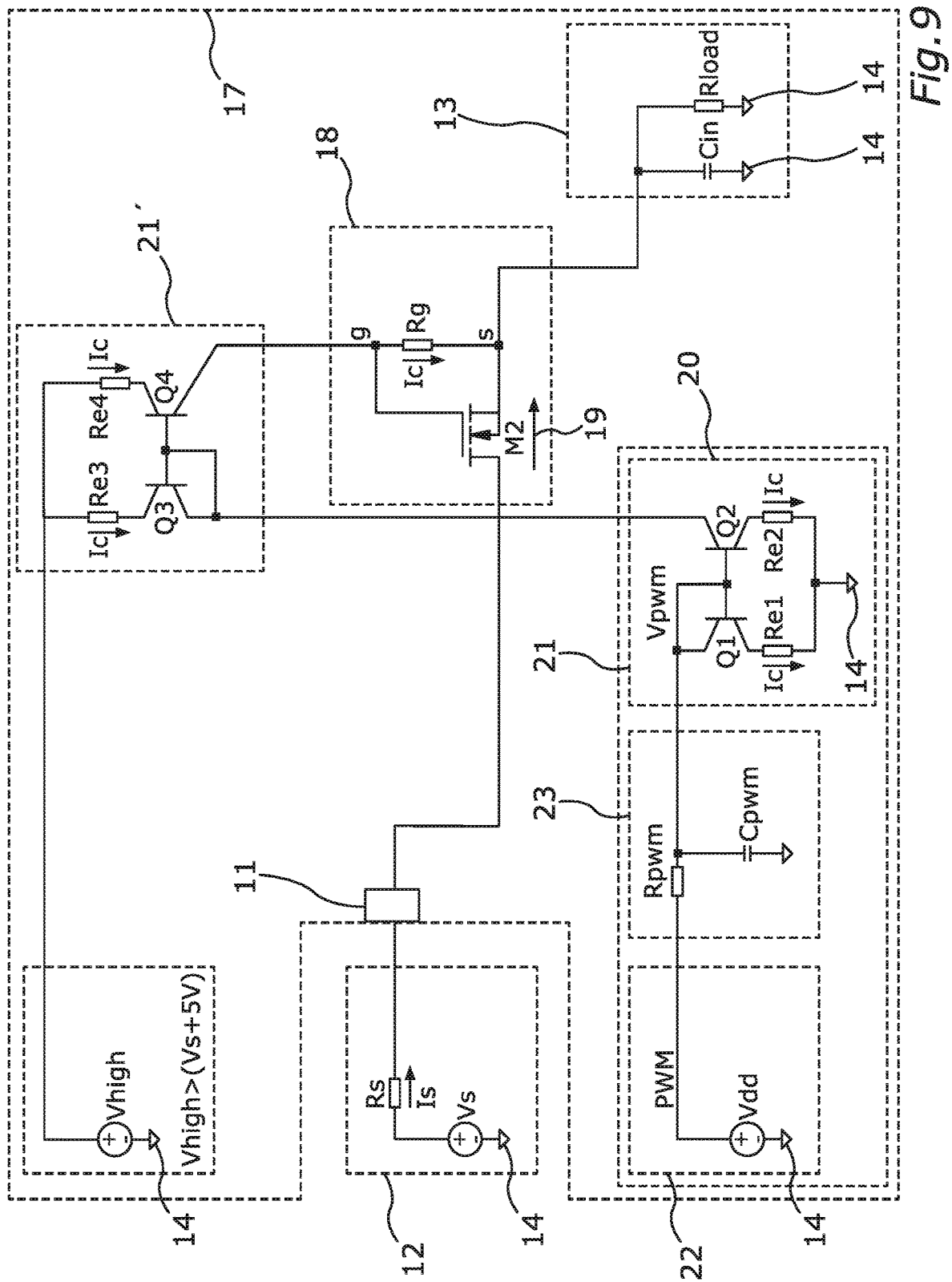
FIG. 9 is a schematic circuit diagram with n exemplary module which has two exemplary current mirrors and one exemplary transistor for the current limitation.

FIG. 9 shows a circuit corresponding to FIG. 8 with just one transistor M2 via whose switching path 19 the input current Is is conducted.

Figure 10:
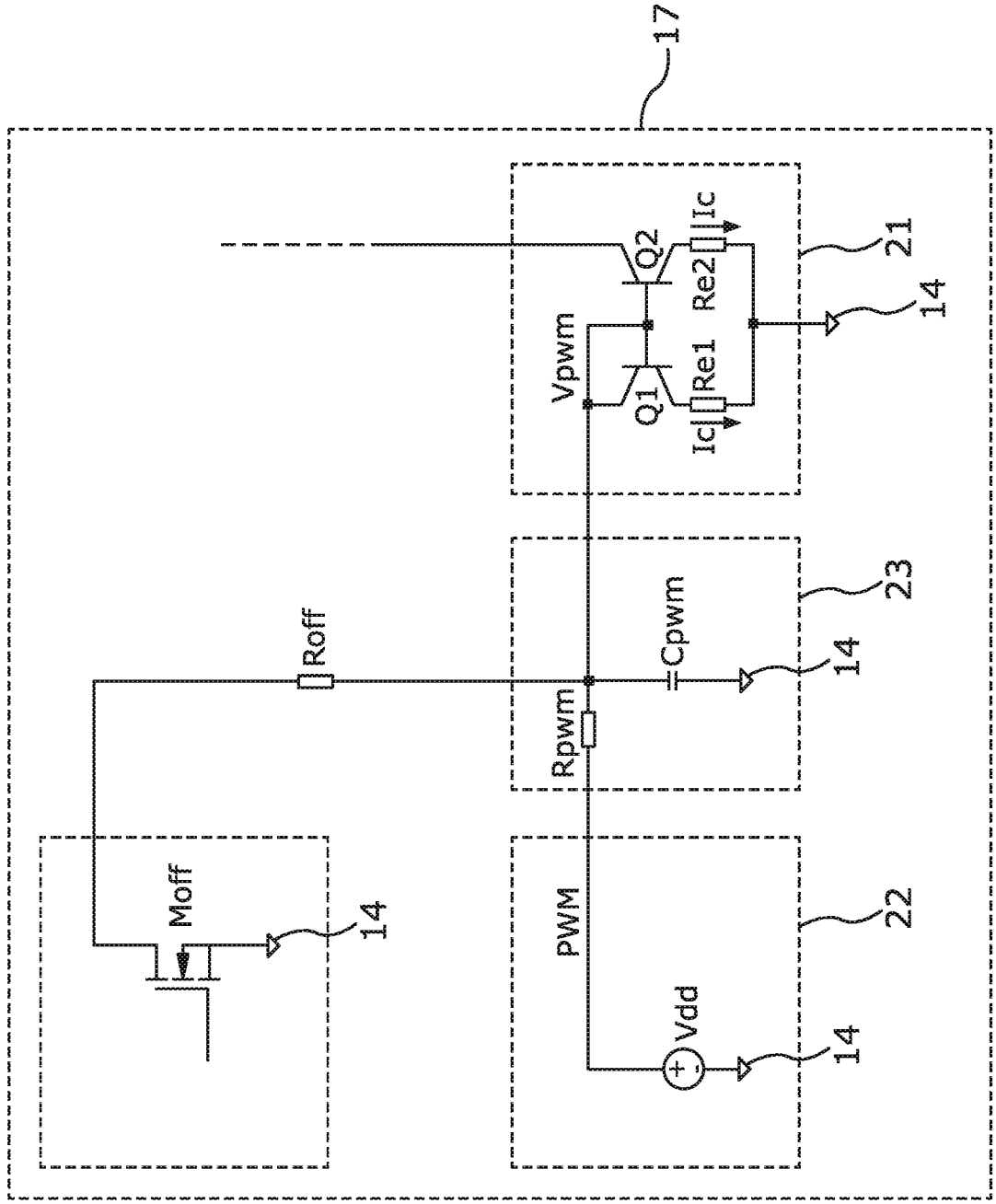
FIG. 10 is a schematic circuit diagram of an exemplary module with rapid switching off.

FIG. 10 shows a portion of a module 17 which additionally has, for rapid switching off, a switch element Moff via which the capacitor Cpwm of the low-pass circuit 23 may be electrically connected to the ground potential 14. When the switch element Moff is switched on, the capacitor Cpwm may be discharged via a discharge resistor Roff. As a result, the actuation signal Vpwm is set to the off value 25' and therefore the transistors M1, M2 of the transistor circuit 18 (and in the case of a single transistor the transistor M1 or M2 of the transistor circuit 18) is switched off. In the case of polarity reversal, this switching off should take place as quickly as possible, e.g. the disconnection of the source terminal 11 from the functional components 18 should be carried out with a time constant which is shorter than the time constant of the low-pass filter circuit 23 itself. Without the switch element Moff the transistors M1, M2 of the transistors circuit 18 remain electrically conductive until their gate voltage drops in absolute terms below the threshold voltage Vgsth, which may take more than 10 ms depending on the dimensioning. To speed up this switch-off process, the switch element Moff is provided, said switch-off element Moff being optionally connected to the positive electrode of the capacitor Cpwm via a protective resistor or discharge resistor Roff. This may speed up the discharging of the capacitor Cpwm. The switch element Moff may be implemented as a transistor. For example, when a microcontroller is used, which microcontroller may also be used for the logic circuit 22, said switch element Moff may be implemented as an open-drain microcontroller Pin or open-drain output of the microcontroller.

Figure 11:
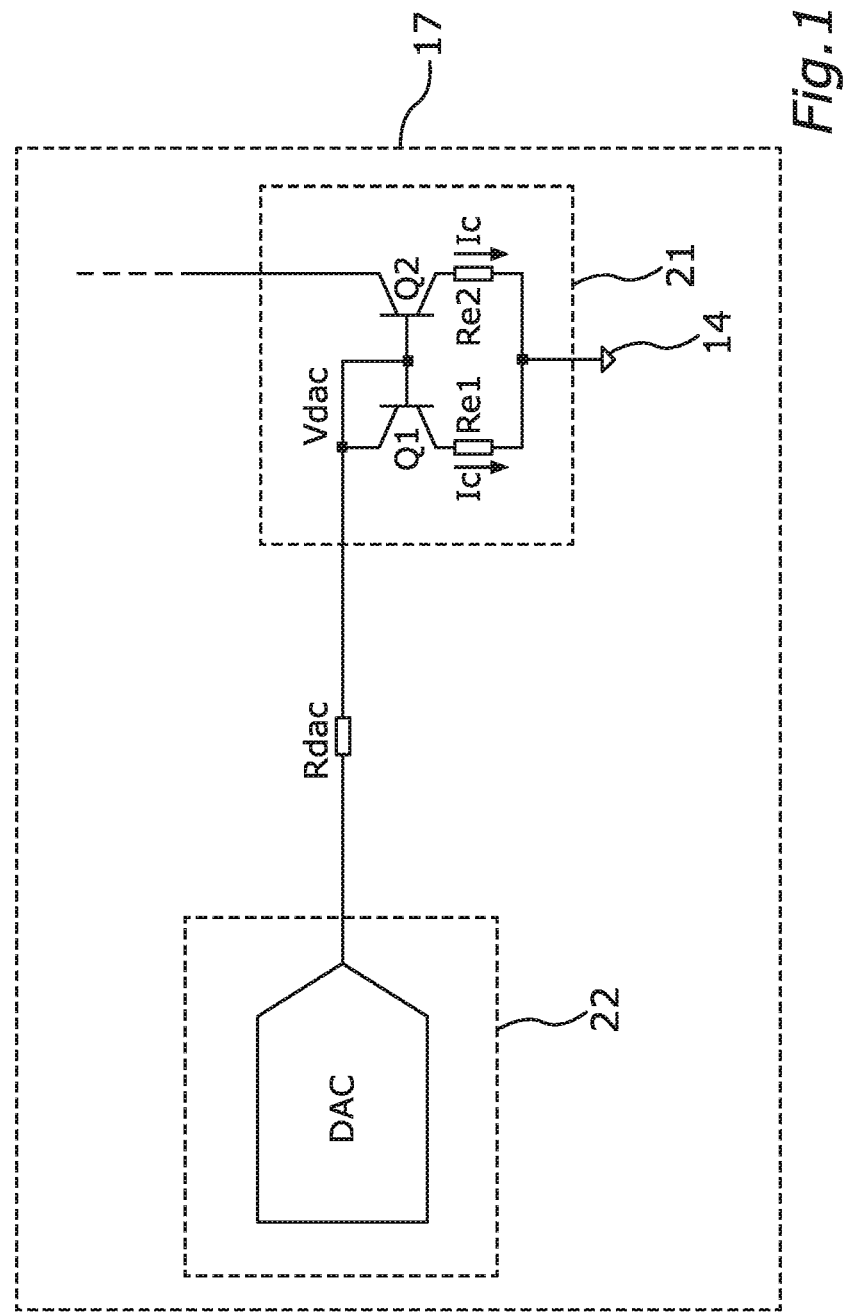
FIG. 11 is a schematic circuit diagram of an exemplary module with a digital-analog converter.

FIG. 11 illustrates a portion of an embodiment of the module 17, in which, instead of a logic circuit 22 with a pulse-width-modulated output signal, an output signal Vdac of a digital-analog converter DAC may be used. Such an output signal Vdac may be generated by a digital-analog converter of a microcontroller. The low-pass filter circuit 23 is then not necessary. Instead of the low-pass filter circuit 23 it is possible to make available a protective resistor Rdac. By a digital-analog converter DAC, the switch-off time may also be reduced in comparison with the use of a pulse-width-modulated signal with low-pass filter circuit 23 connected downstream, since there is no time constant of an RC circuit of the PWM Cpwm present.

The module provides the following advantages:

Flexible adaptation of the amplitude of the switch-on current surge of the input current Is by software: During the manufacture of a plurality of modules, field effect transistors may be used with different FET parameters (for example with a different threshold voltage Vgsth). Software parameterization is then possible by the control program 28 and, in particular, associated with less expenditure of time than the adaptation of an electronic circuit.

It is also possible to use the circuit as a polarity reversal protection: If the actuating microcontroller is supplied by an individual diode (which is usually the case in practice), the proposed circuit in the embodiment variant with the transistor circuit with two transistors M1, M2 switches off in the case of polarity reversal and therefore protects the electronics of the functional components 13 connected downstream.

The circuit is also virtually a switch which disconnects in an ideal fashion with very low leakage current. This is important, for example, when using the circuit in a motor vehicle where a leakage current would run down the vehicle battery. A transistor circuit with two transistors M1, M2 disconnects the voltage source 12 completely from the functional components 13, e.g. a load.

The gate-source voltage Vgs of the transistors M1, M2 is always limited: This limitation does not require any protective elements (Zener diode, suppressor diode, which is also referred to as a TVS (transient voltage suppression) diode) such as are usually necessary to protect the gate g and source s against the connection of transistors M1, M2. The gate g and source s are electrically connected via the resistor Rg (typically less than 2 kg), and at maximum the voltage drop such as is caused by the control current Ic occurs.

The precise impression of the control current and transition thanks to the transistors into current mirror circuits: The current mirror 21, 21' is stable thanks to the use of a double transistor and the regulated Vpwm voltage source such as may be provided in a stable fashion by a microcontroller. Consequently, the control current Ic which is impressed as a result is also stable, which ultimately gives rise to reproducible maximum values 16 of the switch-on value of the input current Is.

The circuit is cost-efficient and economical thanks to the small number of components which are required therefor and as a result it permits the use of a microcontroller which is already present.

Overall, the example shows how a method and circuit for limiting the switch-on current surge (inrush current) of an electronic module may be provided by the subject matter of the disclosure.

The invention claimed is:

1. An electronic module comprising:
a source terminal configured to receive an input current from an electrical voltage source and comprising an electrical input capacitance which is effective with respect to the source terminal, wherein the input capacitance is connected to the source terminal via a transistor circuit, wherein the transistor circuit is configured to conduct the input current via a respective switching path of at least one transistor, and a control device is configured to switch, during a switch-on process for limiting the input current, a control voltage stepwise at a respective control terminal of the at least one transistor, in a plurality of steps, from an off value, at which the respective switching path is switched off, to a connection value, at which a contact resistance of the respective switching path is minimized.

2. The electronic module as claimed in claim 1, wherein the control device is configured to set same profile of the control voltage for each switch-on process without feedback.

3. The electronic module as claimed in claim 1, wherein the control device is configured to set the steps independently of a current operating state of the at least one transistor.

4. The electronic module as claimed in claim 1, wherein the control device has at least one current mirror circuit, and the at least one current mirror circuit is configured to set a control current in an electrical resistance element as a function of an actuation signal, resulting in the control voltage for the at least one transistor dropping across the resistance element.

5. The electronic module as claimed in claim 4, wherein an individual current mirror circuit is provided, and the at least one transistor is in each case a p-channel field effect transistor.

6. The electronic module as claimed in claim 4, wherein the at least one transistor is in each case an n-channel field effect transistor and two current mirror circuits which are connected to form a cascade are provided.

7. The electronic module as claimed in claim 4, wherein the control device has a switching logic which is coupled to the at least one current mirror circuit and which is configured to predefine, by a control program, the actuation signal configured to set the control voltage.

8. The electronic module as claimed in claim 7, wherein the actuation signal is a pulse-width-modulated output signal, conducted via at least one of a low-pass filter circuit of the switching logic and an output signal of a digital-analog converter of the switching logic.

9. The electronic module as claimed in claim 4, wherein an electrode of a capacitor which is configured to reduce a ripple of the actuation signal, is connected to a ground potential via a switch element configured to switch-off of the at least one transistor, and the switch element is configured to electrically connect the electrode to the ground potential as a function of a switch-off signal configured to discharge the capacitor.

10. The electronic module as claimed in claim 1, wherein two transistors whose switching paths are connected in series are provided in the transistor circuit, wherein forward directions of a respective body diode of the transistors are connected in opposing directions.

11. The electronic module as claimed in claim 1, wherein a respective time period of each of the steps has a value which corresponds to a time constant of the input capacitance in such a way that during at least one of one step, two steps, and three steps, the at least one transistor changes from an off state into an electrically conductive state, and the input current rises to a maximum and drops again.

12. The electronic module as claimed in claim 1, wherein the input capacitance is at least one of mainly and completely provided by at least one of a capacitor and a parallel connection of a plurality of capacitors.

13. The electronic module as claimed in claim 1, wherein the at least one transistor is connected, when viewed from the source terminal in a positive line, upstream of both the input capacitance and of further electronic functional components of the module.

14. A motor vehicle comprising an electrical voltage source and the electronic module as claimed in claim 1.

15. A method for limiting an input current during a switch-on process of an electronic module, comprising: connecting an electrical input capacitance of the electronic module to a source terminal of the electronic module via a transistor circuit, wherein during a switch-on process an input current is received from an electrical voltage source via the source terminal, and the transistor circuit conducts the input current via a respective switching path of at least one transistor and configured to, in the process, limit the input current a control device switches a control voltage stepwise at a respective control terminal of the at least one transistor, in a plurality of steps, from an off value, at which the respective switching path is switched off, to a connection value, at which a contact resistance of the respective switching path is minimized.

16. The method as claimed in claim 15, wherein the control device is set to same profile of the control voltage for each switch-on process without feedback.

\* \* \* \* \*